(12) United States Patent
Cox et al.

(10) Patent No.: US 7,061,945 B2
(45) Date of Patent: Jun. 13, 2006

(54) VCSEL MODE-TRANSFORMING PHASE FILTER WITH ENHANCED PERFORMANCE

(75) Inventors: James A. Cox, New Brighton, MN (US); Ralph H. Johnson, Murphy, TX (US); James K. Guenter, Garland, TX (US); Robert Biard, Richardson, TX (US); Klein Johnson, St. Paul, MN (US)

(73) Assignee: Finisar Corporation, Sunnyvale, CA (US)

( * ) Notice: Subject to any disclaimer, the term of this patent is extended or adjusted under 35 U.S.C. 154(b) by 125 days.

(21) Appl. No.: 10/436,069

(22) Filed: May 13, 2003

(65) Prior Publication Data

US 2004/0228379 A1 Nov. 18, 2004

(51) Int. Cl.
*H01S 3/098* (2006.01)
*H01S 5/00* (2006.01)

(52) U.S. Cl. ........................................ 372/19; 372/50.1
(58) Field of Classification Search .................. 375/50, 375/19, 45, 46, 96, 45.01, 46.01, 50.1
See application file for complete search history.

(56) References Cited

U.S. PATENT DOCUMENTS

| | | | |
|---|---|---|---|
| 5,917,848 A * | 6/1999 | Claisse et al. ................ 372/96 |
| 6,144,682 A * | 11/2000 | Sun .............................. 372/45 |
| 6,195,485 B1 | 2/2001 | Coldren et al. | |
| 2002/0006143 A1 * | 1/2002 | Nakayama et al. ........... 375/45 |
| 2002/0141472 A1 * | 10/2002 | Koyama et al. ............... 372/96 |
| 2002/0172247 A1 * | 11/2002 | Sopra et al. .................. 372/46 |
| 2003/0026308 A1 * | 2/2003 | Iwai et al. ..................... 372/46 |

OTHER PUBLICATIONS

Satoshi Shinada et al., "Single High-Order Transverse Mode Surface Emitting Laser with Micromachined Surface Relief," IEICE Trans. Electron., vol. E85-C, No. 4, Apr. 2002, pp. 995-1000.

Shinada, S., et al., "Far field pattern control of single high order transverse mode VCSEL with micromachined surface relief", article from presentation at LEOS conference, Nov. 2001, pp. 564-565.

* cited by examiner

*Primary Examiner*—James Menefee
(74) *Attorney, Agent, or Firm*—Workman Nydegger

(57) ABSTRACT

A vertical cavity surface emitting laser (VCSEL) in which a higher order lasing mode produces a Gaussian-like single mode far field beam intensity pattern. Such a VCSEL includes a protective surface deposition on a VCSEL structure, and phase filter elements on the surface deposition. The surface deposition and the phase filter elements implement an optical phase filter that induces optical path difference such that a single mode far field beam intensity pattern results when the VCSEL operates in a higher order lasing mode. The VCSEL can include structures that enhance a selected higher-order operating mode and/or that suppress unwanted operating modes.

17 Claims, 5 Drawing Sheets

VCSEL MODE-TRANSFORMING PHASE FILTER WITH ENHANCED PERFORMANCE

CROSS-REFERENCE TO RELATED APPLICATIONS

Not Applicable.

BACKGROUND OF THE INVENTION

1. Field of the Invention

This invention relates to vertical cavity surface emitting lasers. More specifically, this invention relates to using higher order lasing modes in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to produce different laser wavelengths, such as 1550 nm, 1310 nm, 850 nm, 670 nm, and so on. In general, VCSELs include semiconductor active regions, distributed Bragg reflector (DBR) mirrors, current confinement structures, substrates, and electrical contacts.

FIG. 1 illustrates a typical VCSEL 10. As shown, an n-doped gallium arsenide (GaAs) substrate 12 has an n-type electrical contact 14. An n-doped lower mirror stack 16 (a DBR) is on the GaAs substrate 12, and an n-type graded-index lower spacer 18 is disposed over the lower mirror stack 16. An active region 20, usually having a number of quantum wells, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type GaAs cap layer 8, and a metallic electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that is usually formed either by implanting protons into the top mirror stack 24 or by providing an oxide layer. The oxide layer can be formed, for example, in accordance with the teachings of U.S. Pat. No. 5,903,588, which is incorporated by reference. The insulating region 40 defines a conductive annular central opening 42. Thus, the central opening 42 forms an electrically conductive path through the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the metallic electrical contact 26, and out of the surface of the vertical cavity surface emitting laser 10.

It should be understood that FIG. 1 illustrates a common VCSEL structure, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. In particular, some applications require a high power laser source that produces a Gaussian-like beam intensity distribution in the far field. Unfortunately, VCSELs can and do support a large number of higher order lasing modes, conventionally designated in the LP approximation as m,l modes. In particular, modes with m>0, and with l=1, that produce "donut" or "necklace" or "flower-petal" beam intensity distributions that do not have the required far field properties. On the other hand, other applications, such as high-speed data communication over multi-mode optical fiber, often achieve best performance if the far field intensity is derived from a specific higher-order "necklace" mode.

One method of obtaining the desired Gaussian-like beam intensity distribution is to reduce the diameter of the active region. While this is successful in quenching higher order modes, a small diameter active region results in low output power, a large series resistance, and tight fabrication tolerances.

Fourier optics provides for phase-shift apertures that can filter and/or tailor the far-field intensity distributions of an incident field. Recent art has demonstrated the use of a phase filter in the aperture of a VCSEL that tailors a higher-order "necklace" incident mode into a far-field beam intensity distribution that appears Gaussian-like. For example, S. Shinada et al. in "Far Field Pattern Control of Single High Order Transverse Mode VCSEL with Micromachined Surface Relief" discloses the use of micromachined top surfaces layers that produce alternating $\pi$-phase shifts. The alternating $\pi$-phase shift layers can produce a reasonable Gaussian-like single-mode far field pattern.

While S. Shinada et al. disclose a technically interesting concept, their approach is less than optimal for many practical applications. For example, S. Shinada et al. use a focused ion beam to etch the top layer of the VCSEL to form the alternating $\pi$-phase shift layers. This can induce damage on the VCSEL itself. Furthermore, it is difficult to accurately control the phase shifts of the individual layers to achieve optically neutral slices. That is, a slice that does not modulate the reflection, as seen from the cavity, or the transmission, as seen from the far field.

Therefore, an improved Fourier optical system that produces a single-mode far field intensity distribution pattern from a higher order lasing VCSEL would be beneficial. Also beneficial would be a VCSEL having an optical phase filter that forms a Gaussian-like single mode far field pattern from a higher order lasing mode, with the optical phase filter implemented by a surface deposition of pie-slice filter elements that not only produce suitable optical path length differences to achieve the far field distribution, but that also protect the surface of the VCSEL. Even more beneficial would be a VCSEL having an optical phase filter that forms a Gaussian-like single mode far field beam intensity pattern from a selected higher order lasing mode, with the VCSEL implemented in a manner that promotes the selected higher order lasing mode. Also beneficial would be a VCSEL having an optical phase filter that forms a single mode far field beam intensity pattern from a selected higher order lasing mode, with optical structures that promote the selected higher order lasing mode, and with electrical current confinement that produces current flow into the active region that tends to enhance the selected higher order lasing mode. Further, in some circumstances it is beneficial to have a far field intensity resembling a specific higher-order mode pattern that is created by converting a lower-order lasing mode. Thus, the optical phase filter is preferably used in conjunction with other techniques that tend to pin the operating mode of the VCSEL to a selected mode.

SUMMARY OF THE INVENTION

Accordingly, the principles of the present invention are directed to a new VCSEL design in which a higher order lasing mode produces a Gaussian-like single mode far field beam intensity pattern.

The principles of the present invention are also directed to a new VCSEL design in which a lower-order lasing mode produces an intensity distribution resembling a specific high-order mode pattern in the far field.

The principles of the present invention extend to techniques that protect the VCSEL and to techniques that improve the available optical power of intensity distributions in the far field, the intensity distributions being created either by converting a lower-order lasing mode to a higher-order lasing mode or by converting a higher-order lasing mode to a lower-order lasing mode.

A VCSEL according to the present invention is comprised of a surface deposition on a VCSEL structure, and of phase filter elements that are fabricated on the surface deposition. The phase filter elements implement an optical phase filter that induces optical path length difference between adjacent phase filter elements such that (1) a Gaussian-like, single mode far field beam intensity pattern results when the VCSEL operates with a higher order lasing mode, or (2) an intensity distribution resembling a specific high-order mode pattern in the far field results when the VCSEL operates with a lower-order lasing mode. Beneficially, the phase filter elements are comprised of different materials, with the thickness of one material being dependent on the first material. Also beneficially, the VCSEL is protected by the surface deposition. With a specific configuration of the phase filter elements, for example, by adding additional phase shift levels, the optical power of the desired far-field intensity distribution can also be significantly increased.

Preferably, the phase filter elements are used in conjunction with a structure or with structures that tend to pin the VCSEL operating mode at a selected operating mode. For example, metal contact fingers can be added to ohmic contact metal such that the metal fingers create current distributions in the active region so as to support a selected operating mode. Alternatively, implants can be added to the top mirror structure to tailor the conductive paths to those that support the selected operating mode.

Another set of structures that tend to pin the VCSEL at a selected operating mode act by suppressing unwanted VCSEL modes. For example, optical losses for unwanted operating modes can be increased by incorporating antireflective zones, thin scattering zones, or absorptive regions that are located at the null field(s) of the selected operating mode. Such structures tend to quench lasing of the unwanted optical modes but do not significantly impact the selected operating mode. Another approach is to suppress the fundamental and lower order modes by adding "inverse fetch" regions (zones of lower reflectivity), high resistance regions, or optical absorptive structures near the central axis.

Yet another set of structures that pin the VCSEL to a selected operating mode is oxide-confined cavities that are located near the active region and that produce an effective confining index difference such that the selected operating mode is operationally preferred. Beneficially, large oxide apertures should be used.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate various embodiments of the invention and together with the description serve to explain the principles of the invention.

In the drawings.

Figure 1:
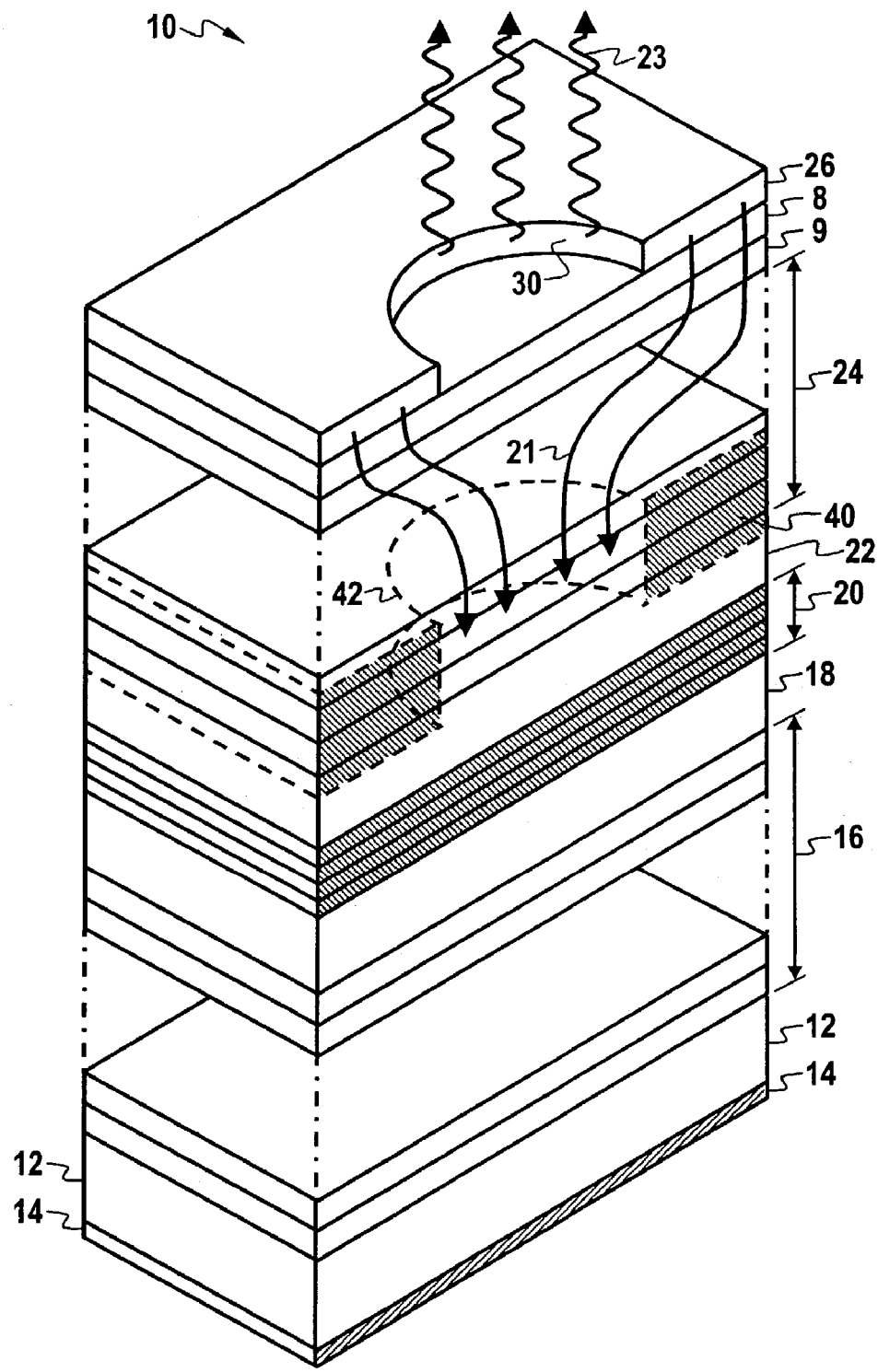
FIG. 1 illustrates a typical VCSEL.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENT

One of the principles of the present invention provides for VCSELs having optical phase filters for converting a near field higher-order mode operation to a far field Gaussian-like single mode operation. Another principle of the present invention provides for VCSELs having optical phase filters for converting a near field lower-order mode operation to an intensity distribution resembling a specific high-order mode pattern in the far field. Those principles further include the use of a structure or structure(s) that tend to pin the operating mode of the VCSEL to a selected mode or that tend to suppress unwanted operating modes.

The previously mentioned disclosure of S. Shinada et al., "Far Field Pattern Control of Single High Order Transverse Mode VCSEL with Micromachined Surface Relief," discussed π-phase shift layers formed by micromachining a surface of a VCSEL. Shinada et al. phase shift layers resembles a pie having an even number of equally sized slices, with adjacent slices inducing alternating phases shifts of 0 and π. In actuality, adjacent slices could produce phase shifts of 2Nπ and (2N+1)π, where N=0, 1, 2, 3, . . .

Shinada et al. disclose depositing a phase-shifting dielectric layer, such as $SiO_2$ or $Si_3N_4$, on etched "pie-slice" shaped VCSEL structures that are separated by trenches. The film thickness and materials, as well as the etch depth must be controlled to produce an optical path difference of λ/2 between adjacent VCSEL structures. Implementing such a VCSEL can damage the VCSEL structures and requires difficult process controls.

A far field analysis of the Shinada et al. VCSEL structure will be useful in what follows. Since a VCSEL commonly exhibits cylindrical symmetry it is best described in cylindrical coordinates (r, φ, z). The physical mechanisms that lead to mode confinement in a VCSEL, such as refractive index distribution, generally depend only on the radial coordinate r and are independent of the azimuthal angle φ. Thus, the modes supported by a VCSEL can be designated by two indices—a radial index 1 and an azimuthal index m—and have the following general functional form:

$$F_{ml}(r,\phi) = G_{ml}(r)\exp(im\phi). \qquad (1)$$

The function describing the radial dependence, $G_{ml}(r)$, is determined by the radial variation in the refractive index. For example, if the refractive index is a step function having a value $n_{core}$ in the aperture and a smaller value $n_{clad}$ outside the aperture, then $G_{ml}(r)$ are Bessel functions ($J_m(r)$ in the aperture and $K_m(r)$ outside the aperture).

When the field described by equation (1) is propagated to the VCSEL surface, (accounting for transmittance), and squared, it yields the near-field intensity distribution for that mode. The angular intensity distribution in the far-field is found by multiplying the field amplitude in (1) by an aperture transmittance (or phase) function, Fourier transforming, taking the real part, and squaring. Specifically, let M be the number of slices in the aperture phase filter (M must be an even integer).

$$M=2L, L=1, 2, 3, \ldots \qquad (2)$$

The transmittance (phase) function of the filter is then:

$$t_M(\phi)=\exp(i\pi(n-1))2\pi(n-1)/M < \phi < 2\pi n/M, n=1, 2, 3, \ldots, M-1, M \qquad (3)$$

The far-field intensity (watt/sr) for mode l,m is then:

$$I_{ml}(\theta,\phi) = [\mathcal{H}[FT\{G_{ml}(r)\exp(im\phi)\, t_M(\phi)\}]]^2, \qquad (4)$$

where θ, φ denote the polar and azimuthal angles, respectively, and FT denotes the Fourier transform. The Fourier transform in cylindrical coordinates, sometimes called a Hankel transform, is straightforward to evaluate. The result is:

$$S_{ml}(\theta,\phi) = \Sigma_n c_n (1/i)^n \exp(in\phi) \int_{aperture} G_{ml}(r) J_n(k_r r) r\, dr, \qquad (5)$$

and $c_n$ is the azimuthal coefficient:

$$c_n = \int_0^{2\pi} t_M(\phi)\exp(i(m-n)\phi)\, d\phi. \qquad (6)$$

The summation in n extends over all integers in the domain (−∞,∞). The polar angle θ can be expressed in terms of the radial component of the wavevector:

$$k_r = (2\pi/\lambda) n_{surr} \sin(\theta), \qquad (6)$$

where $n_{surr}$ is the refractive index of the surrounding medium (usually air).

Generally, one finds a θ-dependence in the far-field intensity having a shape similar to the radial variation of the underlying VCSEL mode. For now, it is sufficient to examine only the azimuthal coefficients $c_n$ in order to understand the behavior of the phase filter.

Based on the foregoing, it can be shown that a phase filter design similar to that of Shinada et al. (M=8) will convert a fundamental mode (m,l=0,1) VCSEL output into a far-field pattern that looks like a number of "donut" shaped intensities starting with a maximum amplitude at azimuthal index 4. Conversely, a VCSEL output of a mode m=4 (which looks like a "necklace" having eight "pearls") is transformed by the phase filter into two different modes in the far-field, one of which looks like a fundamental mode and the other (of equal amplitude) which looks like a 16-pearl necklace. The trend is clear, to produce a "fundamental-like" mode in the far-field the VCSEL should predominately lase in a selected higher-order mode with m=M/2. Thus, if a VCSEL lases predominately in a necklace mode with m=5, (10 "pearls" in the near-field) then a 10 slice phase filter on the VCSEL will produce a "fundamental-like" mode in the far-field.

The principles of the present invention use the foregoing as a basis to provide new, useful, and nonobvious VCSELs having optical phase filters that tend to produce either a single mode intensity distribution pattern in the far field when the VCSEL lases in a higher order mode or an intensity distribution resembling a specific high-order mode pattern in the far field when the VCSEL lases in a lower-order lasing mode. Furthermore, such VCSELs can include a structure or structures that tend to suppress unwanted operating modes and/or that tend to pin the VCSEL operating mode to a selected operating mode that matches the optical phase filter characteristics.

Figure 2:
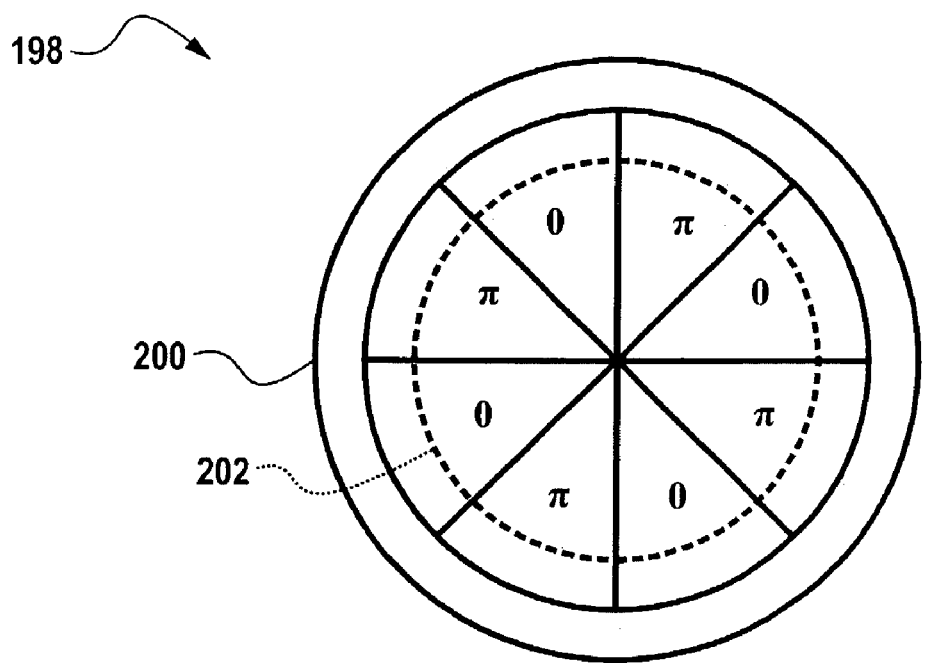
FIG. 2 illustrates a schematic plan view of a VCSEL that is in accord with the principles of the present invention.
Figure 3:
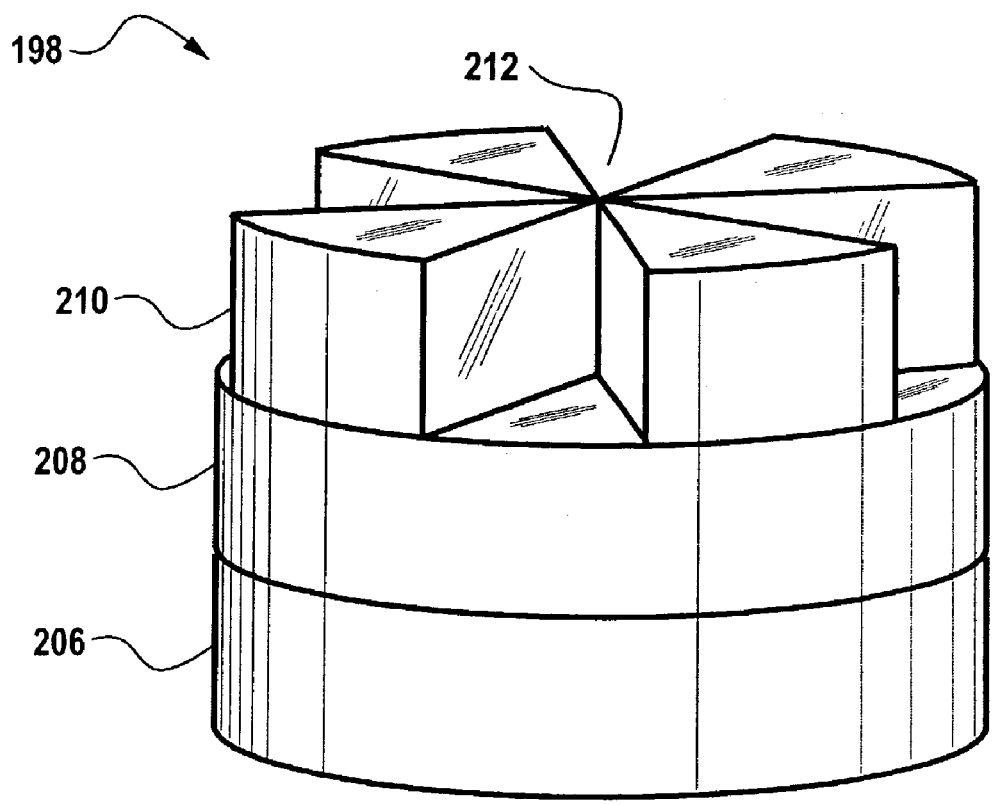
FIG. 3 illustrates a schematic, isometric view of the VCSEL of FIG. 2.

FIGS. 2 and 3 illustrate a first VCSEL 198 that incorporates the principles of the present invention. FIG. 2 schematically depicts a simplified top down view of the VCSEL 198 while FIG. 3 shows a simplified isometric view (without a metal contact). The VCSEL 198 includes a metal contact 200 (not shown in FIG. 3 for clarity) that introduces current into an active region (reference, for example, the active region 20 and the p-type conduction layer 9 of FIG. 1). The VCSEL 198 includes an underlying (oxide or gain guide) aperture 202 (reference, for example, the central opening 42 of FIG. 1) for applying current to the active region.

Turning now to FIG. 3, the bottom cylinder 206 of the VCSEL 198 schematically represents the light-emitting portions of the VCSEL 198. Reference the top mirror stack 24, the p-type conduction layer 9, the p-type GaAs cap layer 8, the aperture 30, and the p-type electrical contact 26 of the vertical cavity surface emitting laser 10 of FIG. 1.

Still referring to FIG. 3, over the bottom cylinder 206 is a middle cylinder 208 that is comprised of a suitable optical material (e.g. a dielectric such as oxide or nitride, or a semiconductor material latticed-matched to the VCSEL) that shifts the phase of the emitted laser light by a half-wavelength (λ/2). The middle cylinder 208 physically protects the bottom cylinder 206 while providing an optically neutral base for a pie-slice phase filter that is comprised of pie-slice phase filter elements 210.

As shown in FIG. 3, the pie-slice phase filter is comprised of equal numbers of interlaced pie-slice phase filter elements 210 and open areas 212. The pie-slice phase filter elements 210 and open areas 212 are implemented to produce an optical path difference that is an integer multiple of $\pi/2$ between the optical path through the open areas 212 and that through the pie-slice phase filter elements 210. It should be pointed out that it is the optical path difference that counts, not the open areas. What is significant is that the optical path difference between adjacent slices (in FIG. 3, between an open area 212 and an adjacent phase filter elements 210) is $(2m+1)(\lambda/2)$, where m=0, 1, 2, . . . . If air (refractive index of 1) is the medium M1 for one slice (an open area 212), then the thickness of the adjacent slice (a phase filter element 210) is:

$$d=(2m+1)(\lambda/2)/(n_2-1),$$

where $n_2$ is the refractive index of the material M2 of the phase filter element 210.

In practice, the simplest case is when m=0. Furthermore, a lift-off process that removes the material M2 from the middle cylinder 208 is probably the easiest to implement, but etch removal techniques are also commonly used.

Ideally each phase filter element 210 is optically neutral such that it doesn't modulate the reflection (as seen from the cavity) or the transmission (as seen from the far field) of the laser beam. This causes the resulting structure to be a pure phase filter, which can be achieved by selecting the phase filter element 210 material M2 such that it has a refractive index of 1.5 or 2.0, i.e., a value such that $(n_2-1)=0.5$ or 1. Either $SiO_2$ (n=~1.47) or $Si_3N_4$ (n=~2.0) are suitable. Furthermore, $TiO_2$ (n=~2.5) is a good choice if m=1. It is also straight forward to use combinations of semiconductor alloys, such as AlGaAs, to satisfy these design requirements. For example, $Al_{0.85}Ga_{0.15}As$ (n=3.07 at 850 nm) and oxidized AlAs (=AlxOy with n=1.55) may be used to implement the phase filter. Other combinations of AlGaAs are also possible with some compromise in the full set of requirements.

The addition of a half-wavelength ($\lambda/2$) protective layer, the middle cylinder 208 in FIG. 3, is highly beneficial not only because it protects the VCSEL light-emitting portions (the bottom cylinder 206) while providing a base for the phase filter, but it also avoids the need to etch the VCSEL light-emitting portions. This acts to improve both reliability and manufacturability.

While the general structures illustrated in FIGS. 2 and 3 are beneficial, they are particularly useful when applied to a VCSEL that is designed to promote lasing in a higher-order operating mode that matches the optical characteristics of the phase filter and/or that tends to suppress unwanted operating modes. That way, more optical power flows through the phase filter. One general technique of promoting higher-order mode lasing is to implement current crowding such that the current into the active region is such that it favors a selected higher-order operating mode (m>0). Another general technique is to suppress the fundamental and lowest-order modes, thus favoring the higher-order operating modes. Yet another general technique is to support higher-order modes by using an oxide-confined cavity that is sufficiently thick and located sufficiently close to the active region so as to produce an effective confining index difference that favors higher-order modes.

Figure 4:
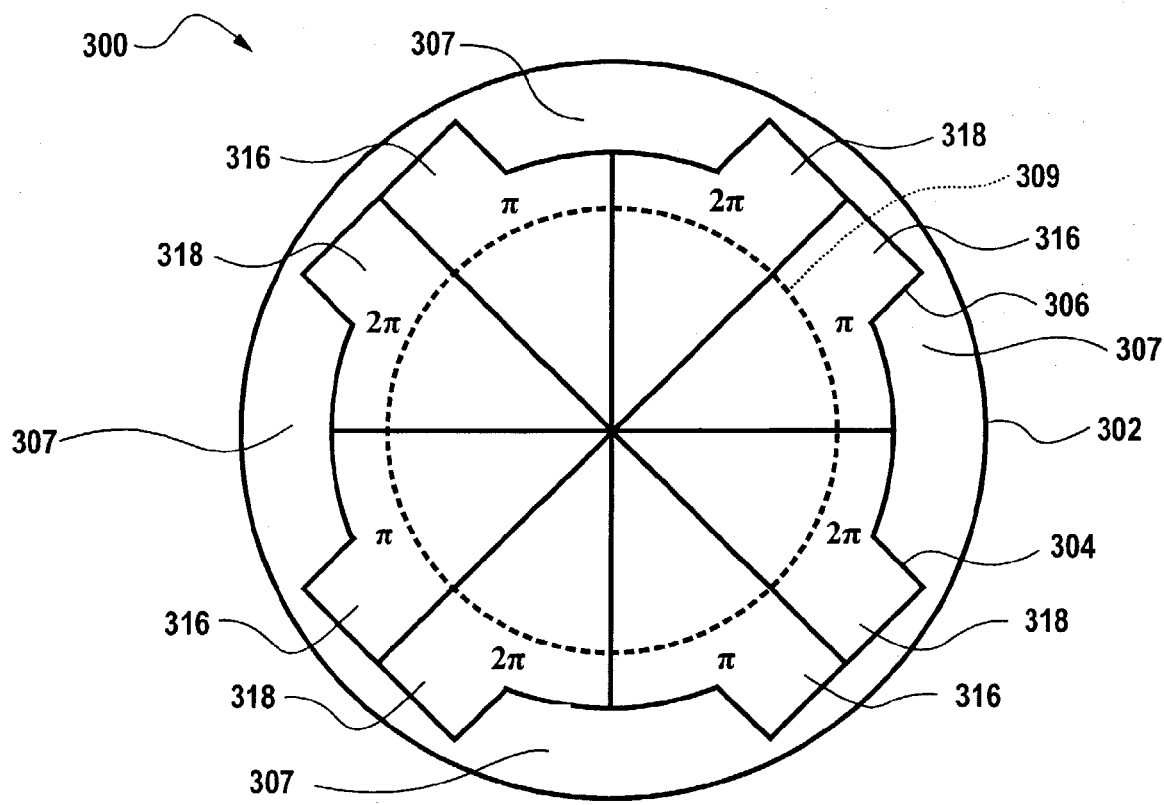
FIG. 4 illustrates a schematic plan view of a VCSEL having ohmic contact metal fingers and an oxidized film for mode confinement.

FIG. 4 illustrates a VCSEL 300 that implements two of the three general techniques described above that tend to favor higher-order operating modes and/or that suppress unwanted operating modes. As shown, the VCSEL 300 includes a metal contact 302 that includes M/2 slots 304 that receive fingers 306 of the VCSEL 300, and that form ohmic contact metal fingers 307. The ohmic contact metal fingers 307 are located and dimensioned to produce current flow into the active region of the VCSEL 300 that enhances a selected higher-order operating mode.

The VCSEL 300 also includes an underlying oxidized film 309 for mode confinement. That oxidized film 309 is located sufficiently near the active region (say below the third period of the top mirror) and is sufficiently thick (having an optical path length of about $\lambda/8$ of the selected operating mode) that it produces an effective confining index difference (between the core and the cladding) such that the selected operating mode is operationally preferred. An effective confining index difference greater than 0.01 is beneficial. Furthermore, a large oxide aperture, say greater than 10 $\mu m$ should be used as it not only enhances the selected higher-order mode but it also improves reliability.

Figure 5:
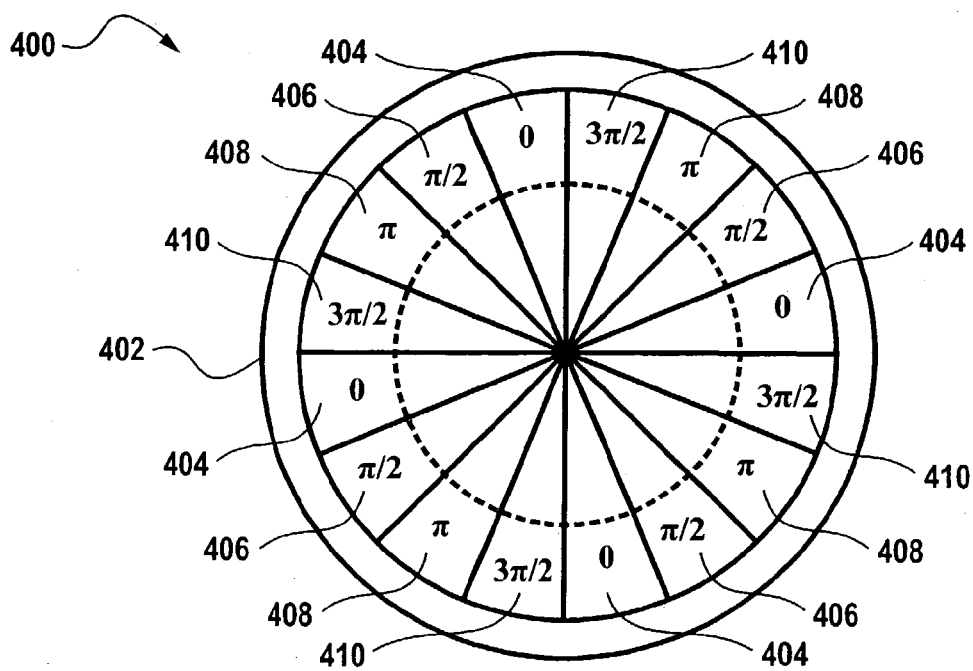
FIG. 5 illustrates a schematic plan view of a VCSEL having phase shift filters configured for the blazing technique.

While the VCSELs in FIGS. 2–4 are beneficial, another technique, referred to as "blazing," can significantly increase the optical power directed into the desired far-field distribution. Referring now to FIG. 5, blazing operates by providing a VCSEL 400 with additional phase shift levels, such as four, that optically interact to produce the desired far-field distribution. As shown, the VCSEL 400 includes a metal contact 402 that surrounds pie-shaped filter slices 404, 406, 408, and 410. The pie-shaped filter slices 404 provide 0 optical phase shifts, the pie-shaped filter slices 406 provide $\pi/2$ optical phase shifts, the pie-shaped filter slices 408 provide $\pi$ optical phase shifts, and the pie-shaped filter slices 410 provide $3\pi/2$ optical phase shifts. Furthermore, adjacent pie-shaped filter slices provide optical phase shifts that differ by $\pi/2$. This enables fine "tuning" of the optical performance of the VCSEL 400 and enhanced filter performance.

Figure 6:
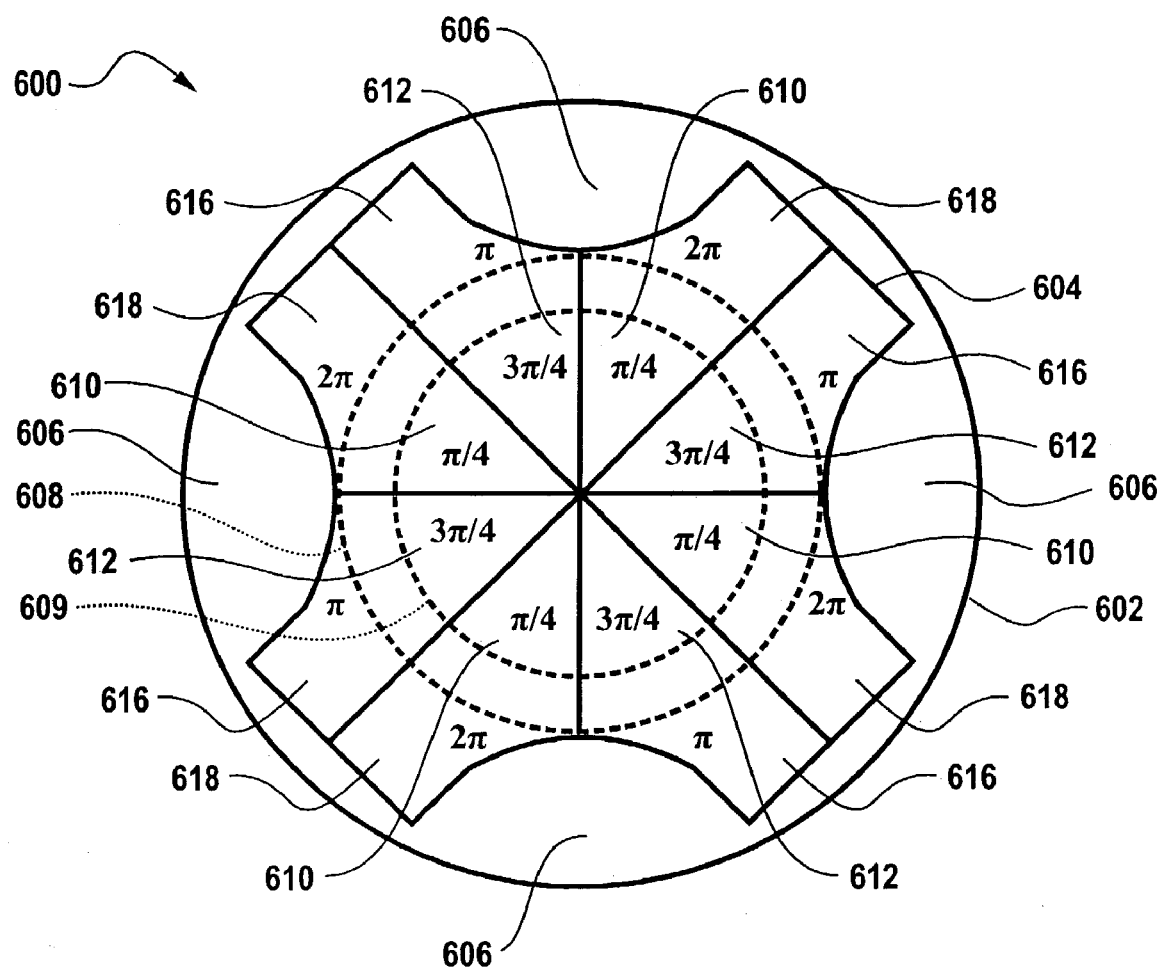
FIG. 6 illustrates a schematic plan view of a VCSEL having ohmic metal contact fingers, an oxide confinement cavity, and an inverse fetch structure.

While FIGS. 2 and 3 provide one technique, and FIGS. 4 and 5 provide others, it should be clearly understood that these techniques are not mutually exclusive. Indeed, the various techniques are complementary and subject to multiple improvements. For example, FIG. 6 illustrates a VCSEL 600 that also promotes lasing in a predetermined higher-order mode. The VCSEL 600 includes a metal contact 602 that includes M/2 slots 604 and contact fingers 606. The VCSEL 600 also includes an underlying (oxide or gain guide) aperture 608 and an inverse fetch structure 609 within the underlying aperture 608. In the present invention, the term "fetch," an acronym for "filter etch," is defined as a pattern of etched films on a VCSEL's top surface intended to produce a specific spatial variation in the reflectance of the top mirror. It is generally applied to promote lasing in a specific mode. Generally, a fetch region includes an inner aperture region of higher reflectance and an outer region of lower reflectance in order to promote lasing in the fundamental mode. Likewise, the term "inverse fetch" refers to the case where the inner aperture region has lower reflectance and the outer region has higher reflectance and tends to suppress the fundamental mode while promoting higher order modes. Still referring to FIG. 6, inside the inverse fetch region 609 are alternating pie-shaped filter slices 610 and 612. The pie-shaped filter slices 610 provide $\pi/4$ optical phase shifts, while the pie-shaped filter slices 612 provide $3\pi/4$ optical phase shifts. The inverse fetch structure creates a region of lower optical reflectivity that inhibits lasing along the central axis of the active region. The pie-shaped filter slices 610 provide $\pi/4$ optical phase shifts, while the pie-shaped filter slices 612 provide $3\pi/4$ optical phase shifts. Outside the aperture 608 are phase shift segments 616 and

618. The phase shift segments 616 provide π optical phase shifts, while the phase shift segments 618 provide 2π optical phase shifts. The phase shift segments 616 and 618 produce suitable phase shifts to produce a desired intensity distribution in the far field.

To add an inverse fetch structure (a zone of lower reflectivity) in the center VCSEL for the suppression of the fundamental and lowest-order modes, a quarter-wave film may be added or subtracted from the VCSEL top mirror. The quarter-wave film may be made of a dielectric or a semiconductor material.

Figure 7:
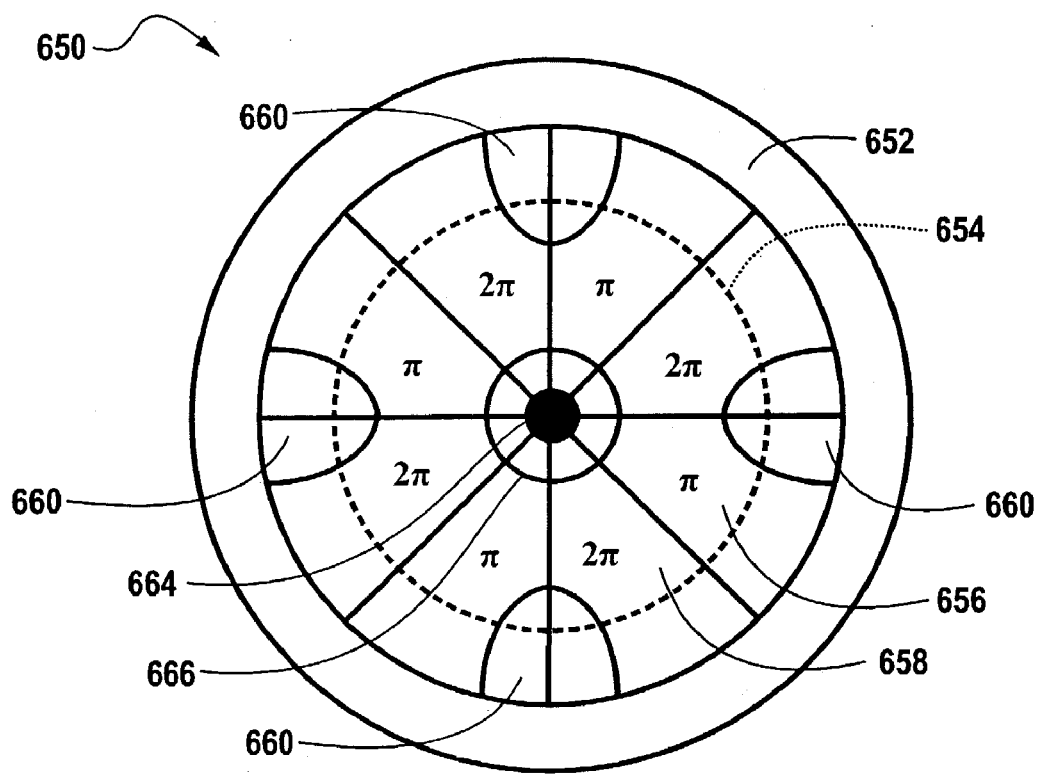
FIG. 7 illustrates a VCSEL having various techniques that tend to suppress the fundamental and lower order operating modes.

The foregoing has described using metal fingers located and dimensioned to produce current distributions in the VCSEL active region that support higher-order operating modes. This tailoring of current distributions can be performed in other ways. For example, FIG. 7 illustrates a VCSEL 650 that also promotes lasing in a predetermined higher-order mode. The VCSEL 650 includes a metal contact 652, an underlying (oxide or gain guide) aperture 654, and phase filter elements 656 and 658. However, the VCSEL 650 further includes mode-matched current confining implants 660. The current confining implants 660, which are located in the top mirror, tailor the conductive paths into the active region so as to enhance the selected higher-order mode.

FIG. 7 also illustrates alternatives to the use of inverse fetch structures. The first alternative is an absorptive zone 664 that attenuates optical beams along the central axis. Since optical beams along the central axis are predominately associated with the fundamental and lower order modes, those modes are suppressed. Such absorptive zones can be comprised of a thin film of titanium or by a heavy doping in the top films. Rather than increasing the optical losses along the central axis to suppress the lower lasing modes, FIG. 7 also illustrates the use of a nonconductive central implant 666. That implant suppresses lower order mode lasing by reducing current flows that support such lasing.

Figure 8:
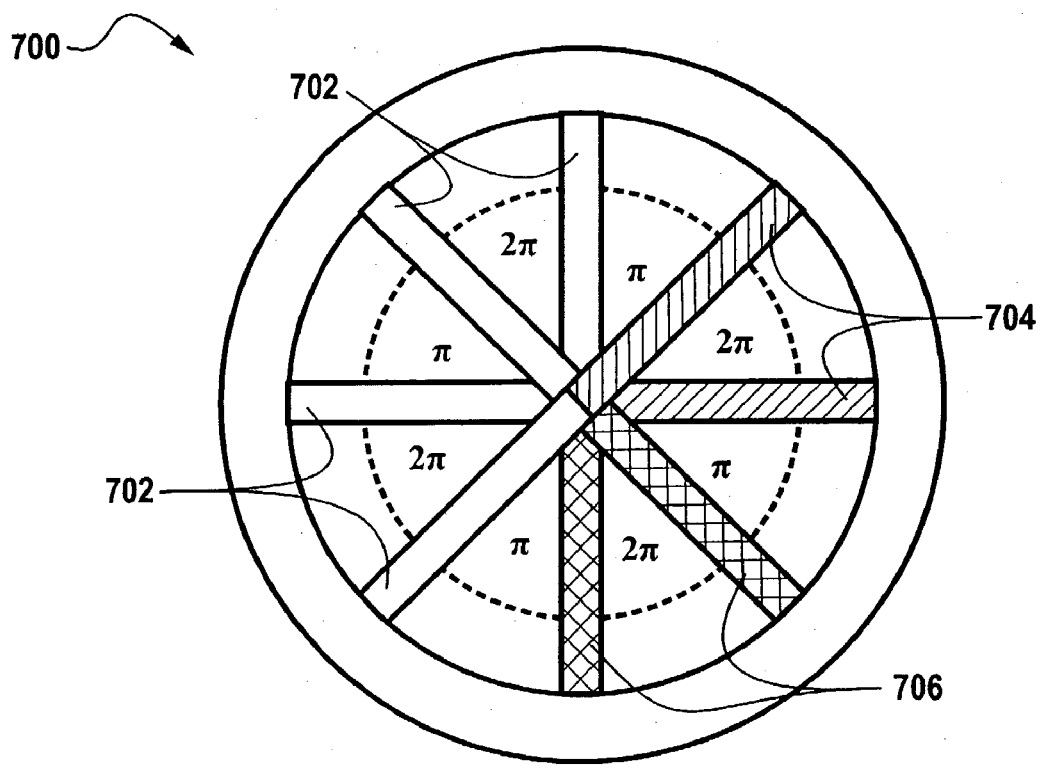
FIG. 8 illustrates a VCSEL having various techniques that tend to enhance a specific higher-order operating mode.

The use of inverse fetch structures to inhibit lower order modes has been previously discussed. A somewhat related idea can be used to enhance the selected higher-order operating mode. For example, FIG. 8 illustrates a VCSEL 700 that includes thin antireflective zones 702. The antireflective zones 702 are located at the field nulls of the selected higher-order operating mode. Thus, the antireflective zones 702 have little effect on the selected higher-order operating mode, but tend to suppress undesired operating modes.

FIG. 8 also illustrates another method of enhancing the selected higher-order operating mode. Instead of using thin antireflective zones 702 at the field nulls, either thin scattering zones 704 that are located at the field nulls or absorptive regions 706 (say thin films of titanium) located at the field nulls can be used. Both methods have little effect on the selected higher-order operating mode, but tend to suppress undesired modes. It should be noted that FIG. 8 shows three different methods of suppressing undesired higher-order operating modes. In practice, using only one of the methods may be beneficial.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A VCSEL device, comprising:
   a VCSEL structure for producing higher-order mode laser light;
   a protective optical material layer on the VCSEL structure, wherein the protective optical material layer is for shifting the phase of the higher-order mode laser light by a half-wavelength ($\lambda/2$); and
   a phase filter on the protective optical material, the phase filter comprised of equal numbers of first phase filter elements and second phase filter elements, wherein the first and second phase filter elements are for shifting the phase of the higher-order mode laser light by phase shifts that differ by about $(2m+1)(\lambda/2)$, wherein m=0, 1, 2, 3, . . . .

2. A VCSEL device according to claim 1, wherein the first and second phase filter elements are pie-shaped.

3. A VCSEL device according to claim 1, wherein the first and second phase filter elements are comprised of different materials.

4. A VCSEL device according to claim 3, wherein the first phase filter elements are comprised of air.

5. A VCSEL device according to claim 4, wherein the thickness of the second phase filter elements is $d=(2m+1)(\lambda/2)/(n_2-1)$, where $n_2$ is the refractive index of the material that comprises the second phase filter elements.

6. A VCSEL device according to claim 1, wherein the second phase filter elements include a material selected from a group consisting of $SiO_2$, $Si_3N_4$, $TiO_2$, semiconductor materials, or combinations thereof.

7. A VCSEL device according to claim 1, wherein the protective optical material layer is one of an oxide, a nitride, a semiconductor alloy lattice-matched to a base material of the VCSEL, and combinations thereof.

8. A VCSEL device, comprising:
   a VCSEL structure for producing a laser light;
   a protective optical material layer on the VCSEL structure, wherein the protective optical material layer is for shifting the phase of the laser light by a half-wavelength ($\lambda/2$); and
   a phase filter on the protective optical material, the phase filter including first phase filter elements and second phase filter elements, wherein the first and second phase filter elements are for shifting the phase of the laser light by phase shifts that differ by about $(2m+1)(\lambda/2)$, wherein m=0, 1, 2, 3, . . . .

9. A VCSEL device according to claim 8, wherein the first and second phase filter elements are pie-shaped.

10. A VCSEL device according to claim 8, wherein the first phase filter elements include a first material and the second phase filter elements include a second material, the first and second materials being different.

11. A VCSEL device according to claim 8, wherein the first phase filter elements include air.

12. A VCSEL device according to claim 8, wherein the second phase filter elements have a thickness of $d=(2m+1)(\lambda/2)/(n_2-1)$, where $n_2$ is the refractive index of the second material of the second phase filter elements.

13. A VCSEL device according to claim 8, wherein the second phase filter elements include a material selected from the group consisting of $SiO_2$, $Si_3N_4$, $TiO_2$, semiconductor materials, and combinations thereof.

14. A VCSEL device according to claim 8, wherein the protective optical material layer is one of an oxide, a nitride, a semiconductor alloy lattice-matched to a base material of the VCSEL, and combinations thereof.

15. A VCSEL device according to claim 8, wherein a number of the first phase filter elements and a number of the second phase filter elements are same.

16. A VCSEL device, comprising:
a VCSEL structure for producing a laser light;
a protective optical means on the VCSEL structure for shifting the phase of the laser light by a half-wavelength ($\lambda/2$); and
a phase filter on the protective optical material, the phase filter including first phase filter elements and second phase filter elements, wherein the first and second phase filter elements are for shifting the phase of the laser light by phase shifts that differ by about $(2m+1)(\lambda/2)$, wherein m=0, 1, 2, 3, . . . .

17. A VCSEL device, comprising:
a VCSEL structure for producing lower-order mode laser light;
a protective optical material layer on the VCSEL structure, wherein the protective optical material layer is for shifting the phase of the higher-order mode laser light by a half-wavelength ($\lambda/2$); and
a phase filter on the protective optical material, the phase filter comprised of equal numbers of first phase filter elements and second phase filter elements, wherein the first and second phase filter elements are for shifting the phase of the lower-order mode laser light by phase shifts that differ by about $(2m+1)(\lambda/2)$, wherein m=0, 1, 2, 3, . . . .

* * * * *

UNITED STATES PATENT AND TRADEMARK OFFICE
CERTIFICATE OF CORRECTION

PATENT NO. : 7,061,945 B2 Page 1 of 1
APPLICATION NO. : 10/436,069
DATED : June 13, 2006
INVENTOR(S) : Cox et al.

It is certified that error appears in the above-identified patent and that said Letters Patent is hereby corrected as shown below:

Column 5
Line 2, change "resembles" to --resemble--

Line 49, Equation 4, change the portion "$L^H[FT$" of Equation (4) to -- $[H[FT$ --

Line 57, Equation 5, change the portion " $\sum_n$ " to -- $\sum_n$ --

Signed and Sealed this

Twenty-fourth Day of June, 2008

JON W. DUDAS
*Director of the United States Patent and Trademark Office*